United States Patent [19] [11] 4,228,483
Haury et al. [45] Oct. 14, 1980

[54] SEQUENTIAL CONTROL ELECTRICAL CHAIN COMPRISING ASSEMBLED COUPLING CONNECTOR MODULES

[75] Inventors: André Haury, Le Raincy; Jacques Marcenne, Poitiers, both of France

[73] Assignee: La Telemechanique Electrique, France

[21] Appl. No.: 886,507

[22] Filed: Mar. 14, 1978

[30] Foreign Application Priority Data

Mar. 14, 1977 [FR] France ............................... 77 07532

[51] Int. Cl.[2] ............................................... H05K 5/02
[52] U.S. Cl. ..................................... 361/393; 361/142
[58] Field of Search ............................... 307/146–149; 339/176 M, 367 O, 219 R, 166 R, 47–49; 361/195, 352, 393, 395, 142; 200/307

[56] References Cited

U.S. PATENT DOCUMENTS

| | | | |
|---|---|---|---|
| 3,054,024 | 9/1962 | Van Dillen | 339/166 R |
| 3,523,268 | 8/1970 | Foster | 339/219 R |
| 3,579,703 | 5/1971 | Schmermund | 361/195 |
| 3,643,135 | 2/1972 | Devore | 361/395 |

*Primary Examiner*—L. T. Hix
*Assistant Examiner*—S. D. Schneyer
*Attorney, Agent, or Firm*—William A. Drucker

[57] ABSTRACT

Associable coupling connector for each of the storage relays of a sequential automatic device.

The coupling connector comprises on the one hand the pins placed at the back of sockets which are assembled in three different areas of the front face, allotted respectively to the relay, to the input signals and to the output signals and, on the other hand, transversal conductors and transversal terminals to receive and transmit the voltage from the supply and the return to zero signal and respectively to transmit the sequential signals from the coupling connectors to the next ones.

5 Claims, 9 Drawing Figures

Figure 1:
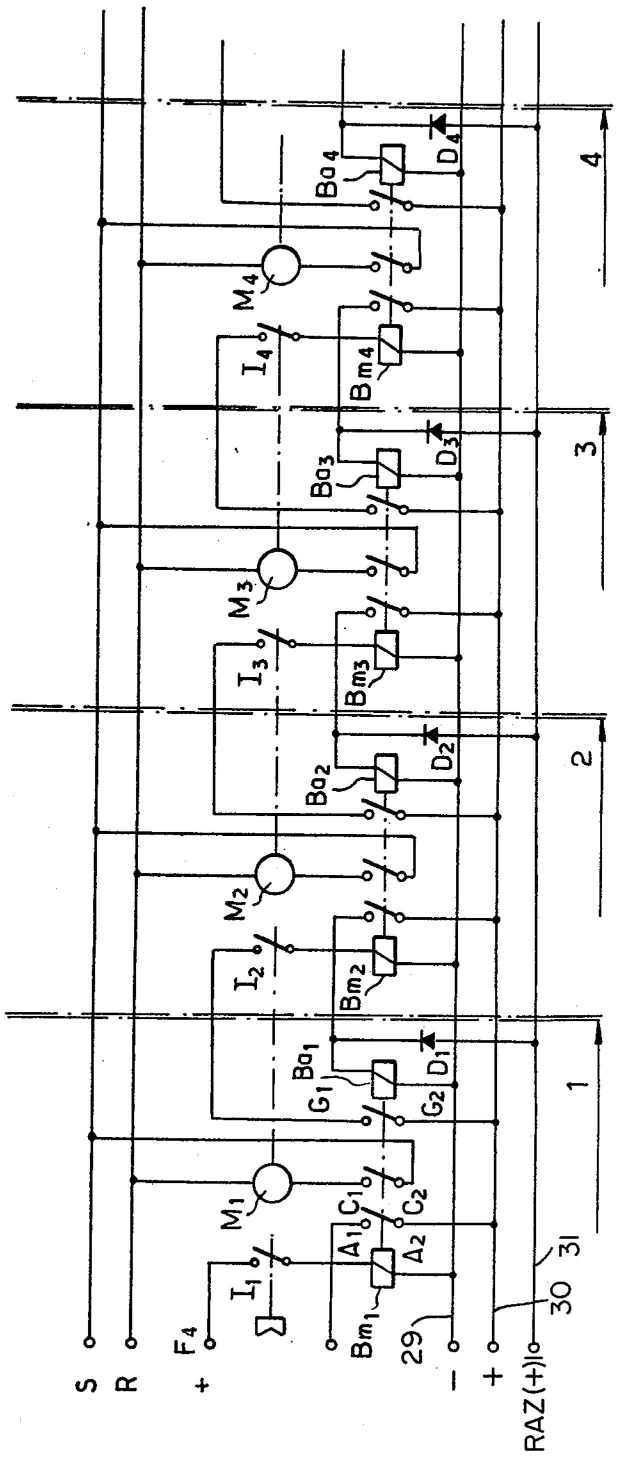

SEQUENTIAL CONTROL ELECTRICAL CHAIN COMPRISING ASSEMBLED COUPLING CONNECTOR MODULES

The invention relates to a coupling connector designed to take each of the storage relays of a multiplicity of relays associated with one another, with the instruments which use them and with the power supplies to constitute a sequential automatic device, and where each coupling connector comprises connecting terminals cooperating with the terminals of the relays, supply terminals connected to the power supplies, input and output terminals connected to the instruments to be controlled in order to supply them with order signals and receive discharge signals from them, respectively, and finally sequence terminals delivering signals putting the next relay into operation and signals switching off the preceding relay.

Instruments of this kind are used in large numbers in sequential control equipment in industrial installations, where at each phase of the sequence a signal connects a storage relay in a first condition, if the input conditions of this signal are right, to transmit an order to a user instrument and where this relay is put into a second condition when, the input conditions for the next phase being right, the placing into the first condition of the relay associated with the next phase causes the application of a release signal to the preceding relay.

The principle of such an arrangement, well known in itself, is widely used in sequential automatic devices.

Coupling connectors are moreover known which conform to the structure defined above and can be used to form sequential chains, but in these instruments measures have generally not been taken to provide for simple cooperation between neighbouring coupling connectors, and similarly no effort has been made to facilitate and systematize the wiring, interconnection and connection of their terminals of the instruments to be controlled or to the power supplies.

The aim of the invention is therefore to provide a coupling connector by means of which the association of the storage relays with one another, with the supply and with the user instruments is simplified and systematized both in regard to mechanical and electrical cooperation and in regard to the design, the embodiment of the automation diagram and, possibly, fault location.

According to the invention, this result is achieved because the output terminals and the input terminals, as well as the connecting terminals, are in the form of conductive surfaces placed at the bottom of sockets, terminals of the same kind are assembled close to one another in three different areas of the coupling connector situated on the same front surface, the supply terminals and the sequence terminals are arranged on two opposite side faces of the coupling connector, each of the supply terminals consisting of one of the opposite ends of a transversal conductor placed in the coupling conductor, and guide means placed on some faces of the coupling connector make it possible to associate and align neighbouring coupling connectors side by side by their side faces which make the contact between the supply terminals and the sequence terminals opposite one another to provide the electrical continuity of the supply lines on the one hand and on the other hand the transmission of sequence signals from one coupling connector to the next.

Figure 2:
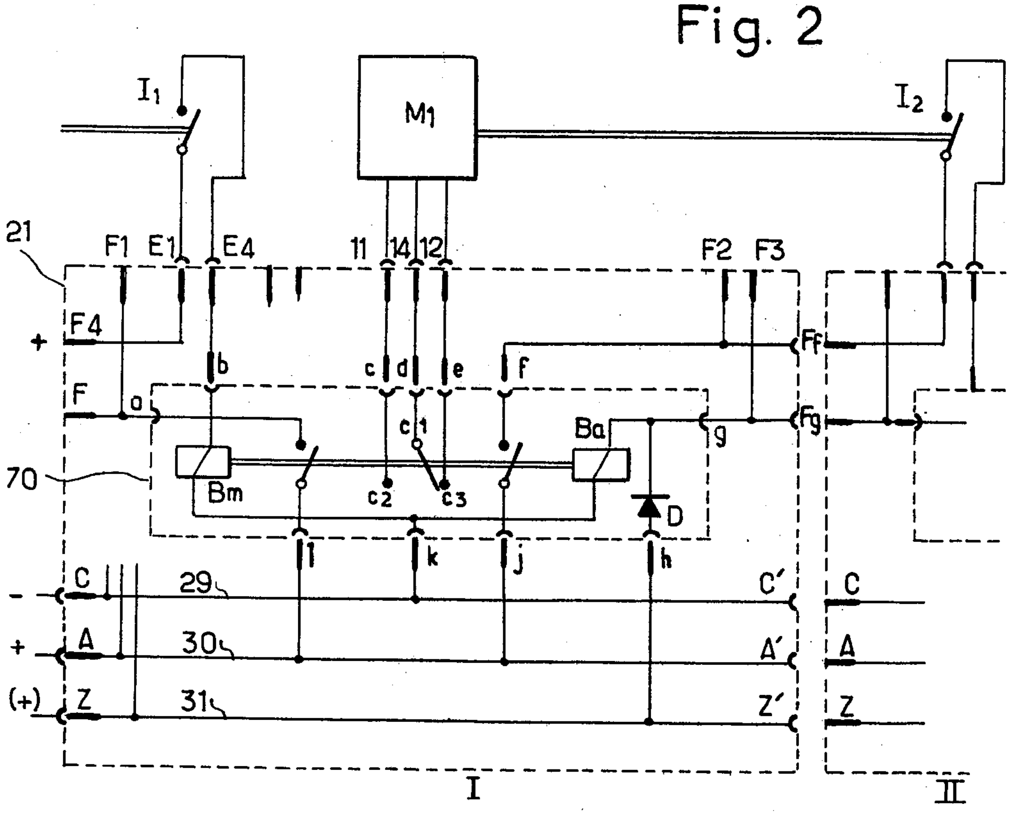
Figure 3:
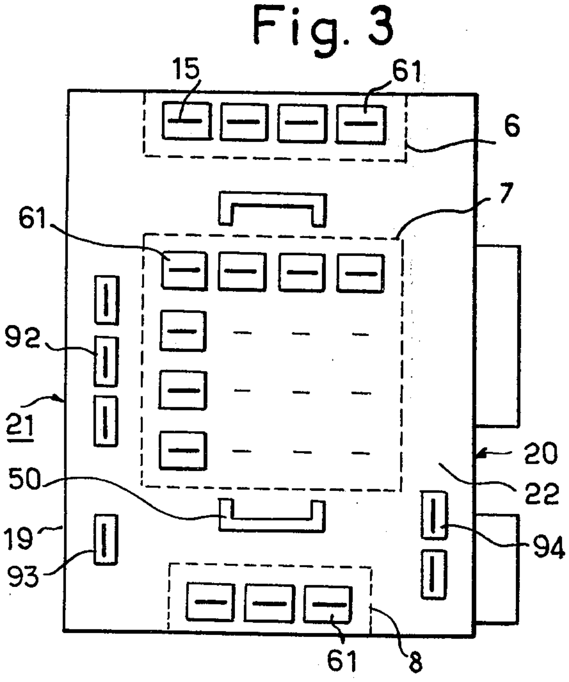
Figure 4:
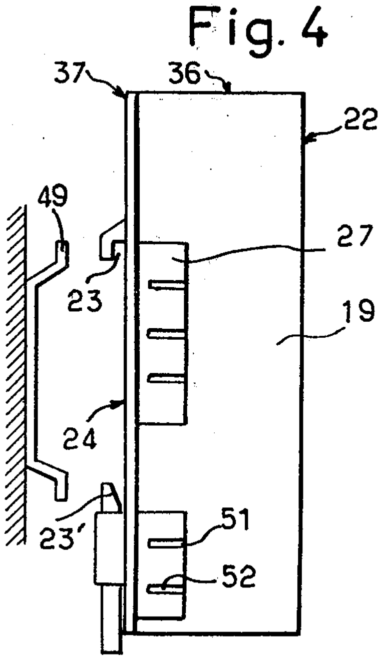
Figure 7:
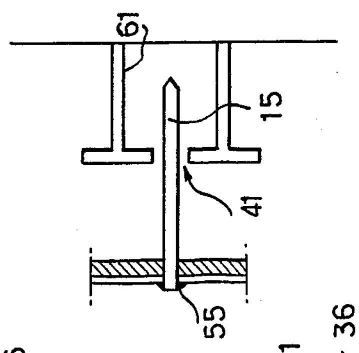
Figure 6:
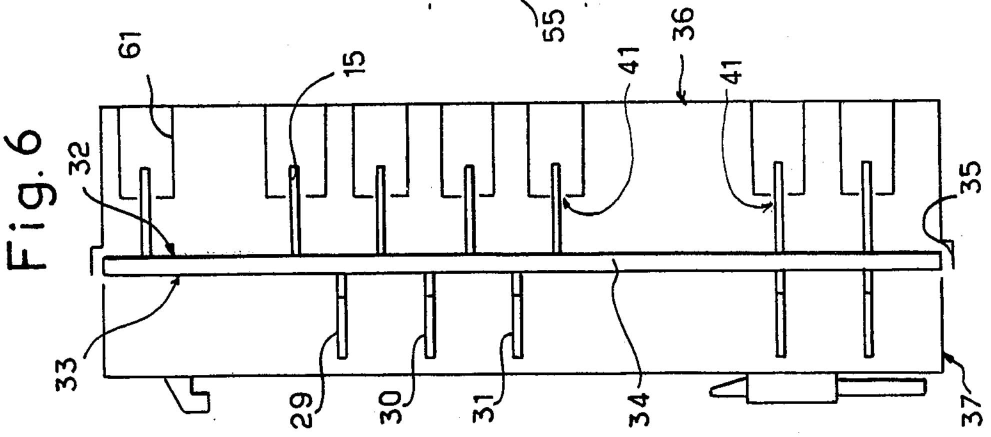
Figure 5:
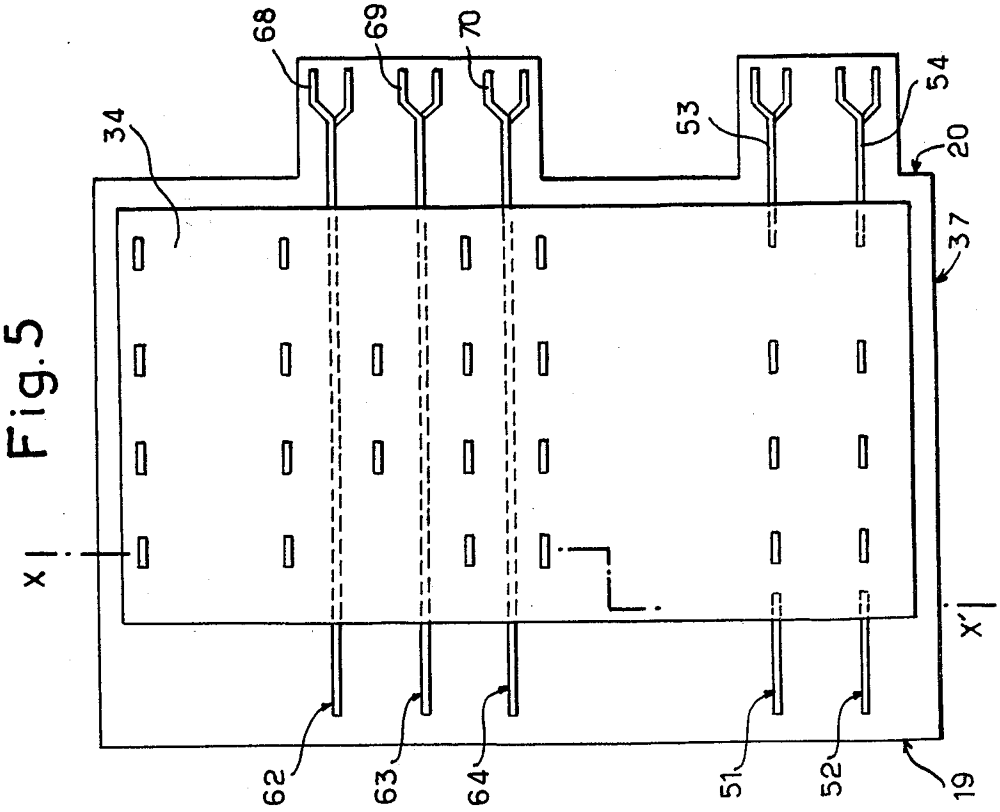
Figure 8:
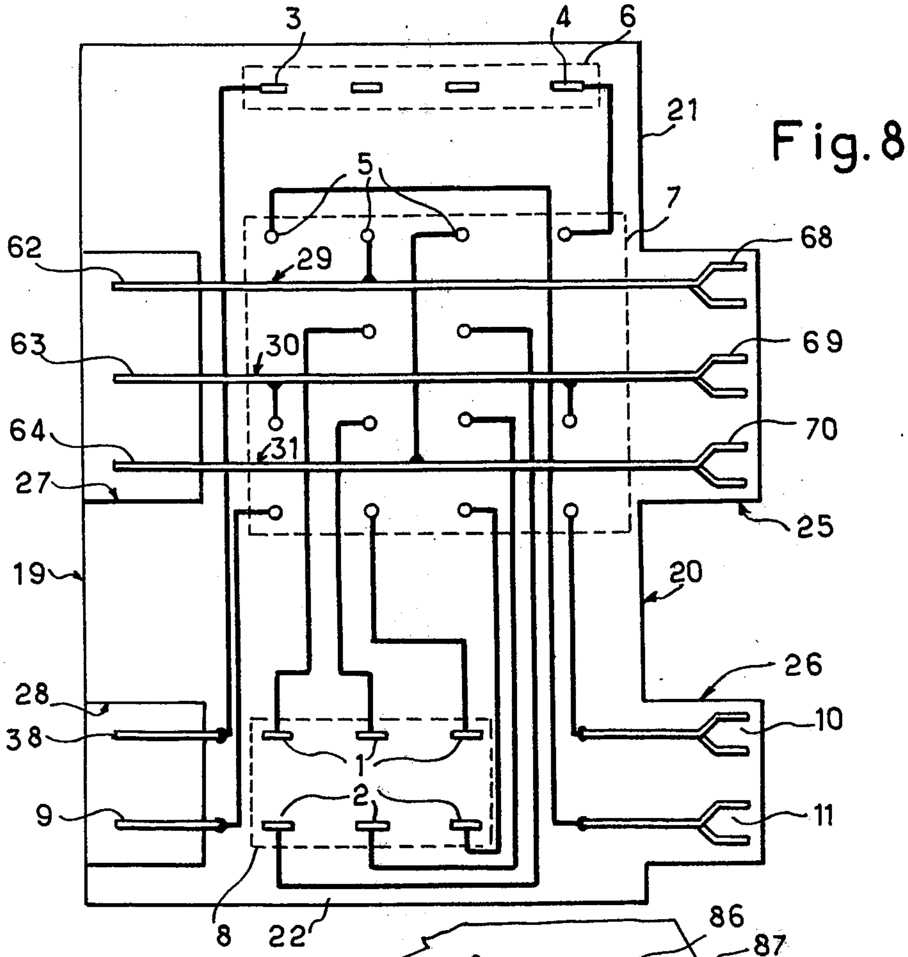
Figure 9:
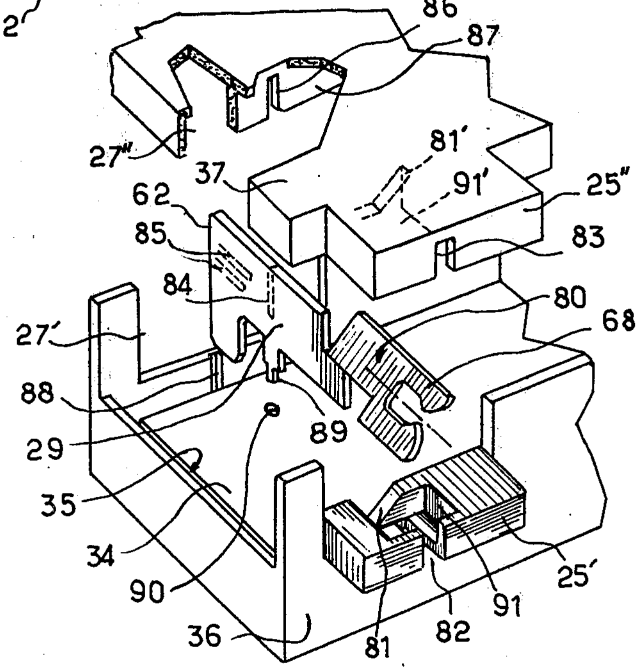

Other features of the invention will emerge more clearly from the following description, which is accompanied by the following figures:

FIG. 1, which shows the diagram of a sequential automatic device using storage relays, FIG. 2, which shows the wiring diagram of a coupling connector according to the invention, FIG. 3 which illustrates a front view of the coupling connector, FIG. 4 which shows a side view of the coupling connector, FIG. 5 which shows, diagrammatically, the inside layout of a coupling connector with the lid off to indicate the presence of a printed circuit, FIG. 6, which shows, diagrammatically, a section of the coupling connector according to FIG. 5, along the line X—X', FIG. 7, which shows in detail the method of guiding a pin, FIG. 8, which illustrates an arrangement of the printed circuits of the card, And FIG. 9, which shows a perspective view, partly exploded, of the devices for holding a flat conductor between the sole and the lid.

The arrangement of a sequential automatic device, which is well known in itself and does not form part of the invention, is illustrated in the diagram shown in FIG. 1 where R and S represent the supply lines to instruments M1 - M2 etc., where the + and − lines represent the supply lines to the sequential automatic device, while line RAZ indicates a line for returning the automatic device to the non-operating condition and where the vertical broken lines define the elements associated with the different successive phases of the sequence of operations.

A storage relay, i.e. a relay having two stable conditions, is associated with each phase of the sequence of operations. This relay can be formed by associating two standard relays, by a polarised relay or else by a mechanically locking relay wherein de-energizing is provided by an extra coil. Such a relay is used in the diagram of FIG. 1 where Bm and Ba are the locking and de-energizing coils.

During phase 1, it is intended, e.g., to put instrument M1 which is dependent thereon, into operation.

Manual switch $I_1$ being briefly closed at the start of the sequence and terminal F4 being connected to the positive pole of a supply, coil Bm1 is excited and its armature is held in position by a mechanical bolt, so that contacts A1, A2, C1, C2 and G1, G2 are kept closed.

Contacts C1, C2 being closed, they put instrument M1 into operation, while contacts G1, G2 also being closed prepare a current circuit going through switch $I_2$ and coil Bm2 associated with phase 2.

When the operation to be carried out by M1 is finished, contact $I_2$ is closed so that coil Bm2 associated with phase 2 is in turn excited, since its current circuit, still closed, is connected to the positive pole of the supply.

As soon as coil Bm2 of phase 2 is excited and its armature locked, contact A1, A2 of the same phase 2 is closed and the circuit exciting coil Ba1 of phase 1 is connected to the positive pole, causing the de-energizing and opening of contacts (A1-A2), (C1-C2) and (G1-G2).

Instrument M1 associated with phase 1 is then no longer in operation, while instrument M2 associated with phase 2 is in turn started up.

The switching cycle is then repeated for phase 2, then phase 3, and so on until the end of the sequential programme.

General excitation of all the coils (Ba1) can be carried out in order to effect a general return to zero by applying a positive potential to the conductor (RAZ).

The excitation current then goes through diodes D1-D2-D3, etc., which are polarised in such a way that excitation of a specific coil Ba1 during the execution of a phase does not extend to the corresponding coils of the phases which are not involved. The diode can advantageously be placed in the relay.

In FIG. 2, all the circuits which are in the small dotted rectangle represent a storage relay in removable form, while all the circuits represented in the large dotted rectangle illustrate the electrical connections made in a coupling connector the embodiment of which will be described below and the purpose of which is to enable the circuit in FIG. 1 to be built up merely by associating these coupling connectors side by side.

The coupling connector (21) shown in FIGS. 3 to 8 consists mainly of a prismatic insulating box whose front face (22) carried by a lid (36) comprises sockets such as (61) assembled in three separate areas (6-7-8) surrounded by dashes in FIG. 3.

At the bottom of these sockets pins (15) are placed so as to project, which may be square, rectangular or cylindrical in section, constituting the various terminals of the coupling connector the connection of which has to be made by the user, see FIGS. 3 to 6.

Area (6) assembles the input terminals such as E1-E4, designed to be connected to switches such as 11, area (7) assembles the connecting terminals such as (a-b-c-d-e-f-. . . 1) designed to be connected to the corresponding terminals of a removable storage relay (70) and area (8) assembles the output terminals such as (11-12-14) designed to be connected to user instruments such as (M1-M2 etc.).

Between these areas there are hooks or bolts such as (50) which serve to hold the relays and define the limits of the areas which have just been described to make wrong connections less probable.

The opposite side faces (19-20) of the coupling connector seen in FIG. 3 comprise sequence terminals (9, 38) and (10, 11) respectively, which correspond to terminals (F-F4) and (Ff, Fg) respectively which can be seen in FIG. 2.

These terminals are made on the one hand in the form of portions of flat conductors (51, 52) see FIG. 5, when they end at the side face (19), and on the other hand in the form of forks (53, 54) when they end at the opposite side face (20).

Similarly, the supply terminals (C,A,Z) and (C', A', Z') respectively in the diagram in FIG. 2 consist of flat portions (62-63-64) and forks (68-69-70) respectively formed at the opposite ends of flat conductors (31-30-29) which go from one side to the other of the coupling connector (see FIG. 5) and constitute the −, +and RAZ lines in the diagram in FIG. 1.

The flat ends (62-63-64) of the supply and return to zero conductors are placed in a housing (27) in the coupling connector giving on to the side face (19) while the forkshaped terminals (68-69-70) are lodged in a prismatic extension (25) of the coupling connector.

Comparably, the flat (51-52) and forked (53-54) ends of the sequence terminals are placed in a housing (28) and an extension (26) of the coupling connector respectively.

Moreover, lid (36) is fixed on a sole (37) see FIG. 4 whose face (24) opposite to face (22) of the lid has hooking means (23, 23') capable of cooperating by ratching with standardised sections (49) termed "cap sections".

Between the lid (36) and the sole (37) there is a housing (35) whose dimensions are selected to take and hold a printed circuit card (34). By welding on its face (32), this card takes all the input, output and connecting pins such as (15) while on the opposite face (33) are welded the flat conductors (29-30-31) which constitute the conductors connected to the +and −potentials of the supply, and the conductor connected to a potential making it possible to effect a general return to zero, as well as flat conductors (51-52) and (53-54) constituting the conductors transmitting the sequence signals through the terminals of the same name.

The printed circuit card moreover comprises its own conductors which make the connections between the pins and the flat conductors shown, as can be seen in FIG. 8.

The connecting, input and output terminals which can be seen in FIG. 7 preferably consist of prismatic pins (15) the base of which is welded on to the printed circuit card at (55) and whose centre area is guided in an opening (41) placed at the bottom of the socket (61).

This arrangement ensures excellent alignment and strictly accurate guiding of said pins.

The flat conductors or portions of flat conductors constituting the supply and return to zero conductors and the sequence terminals are guided and held at their ends by surfaces placed on the lid and on the sole respectively and whose shapes are suited to this function.

The dimensions of the housings (27-28) and the extensions (25-26) as well as their position on the side faces are selected so that when two coupling connectors are placed side by side said extensions penetrate into said housings, making the electrical connection between the flat ends and the forks, by means of the guiding effected by said extensions and said housings.

When two adjoining coupling connectors are associated in this way, their front faces (22) are in the same plane and the opposite faces (24) are in another plane.

Part of the space (35) between the lid (36) and the sole (37), which is and designed to take the printed circuit card (34) also serves to allow the transversel conductors, one of which in particular can be seen in FIG. 9, to pass.

It can be seen that the electrical connection between the transversal conductor (29) and the card (34) is provided by a nipple (89) on the first, penetrating into an opening (90) in the second, while the flat portion (62) is held in a housing formed by the gap (27') in the lid and the gap (27") in the sole, placed between them, using the shapes of the guides (88 and 86) respectively placed on these two elements.

The fork (68) placed at the opposite end is formed in a slanted portion (80) which is held by cooperation of shapes (91-91') and surfaces (81-81') on the lid and the sole. The shapes and surfaces are placed inside two half-portions (25'-25") constituting the extension (25) mentioned above. These two half-portions comprise, additionally, a groove (82) and (83) respectively, giving passage to the flat portion of a conductor from the neighbouring coupling connector whose operative contact surfaces are similar to those shown at (85).

To associate the coupling connectors in order to form a sequential chain, each coupling connector is ratched on to a cap section such as (49) which is itself fixed to a wall, and it is made to perform a sideways sliding movement parallel to the longitudinal section of the section to produce the penetration of the extensions into the housings and make the systematic electrical connections of the supply and return to zero lines and the sequence terminal lines. It can therefore be considered that the hooking means (23-23') are in themselves adequate guide means.

In the diagram in FIG. 2, it can be seen that the sequence terminals (F-Ff-Fg) are respectively connected to additional terminals (F1-F2-F3).

These terminals serve either to ascertain the absence or presence of a voltage at the sequence terminals (which are usually inaccessible) or to apply a voltage to the latter to cause or simulate the performance of a particular phase of the sequence, or again to make loop connections or excitation connections going towards or coming from neighbouring sequential chains.

To retain all the advantages of this arrangement, the additional terminals also consisting of pins such as (15) are positioned in additional sockets (93, 94) in the front face, their shape being different from that of the sockets which take the previously-mentioned pins.

Similarly, the supply and return to zero conductors can be connected to auxiliary terminals, whose pins would be placed at the bottom of sockets of a particular shape (92) giving on to the front face of the coupling connector.

In the device which has just been described, the interconnections between the coupling connectors, the relays and the user instruments are made by means of pins placed in the sockets giving on to the front face.

It is nevertheless obvious that it would be possible to make a coupling connector possessing substantially the same properties of simplicity of wiring and easy association with the neighbouring ones in order to form an automation chain, replacing the pins with sockets or arranging the conductive surfaces differently at the bottom of the sockets.

I claim:

1. A sequential automatic control device for controlling electrical apparatuses which provide feedback signals upon completion of an operation, said control device comprising a plurality of mechanically coupled and electrically interconnected modules, electrical circuit means providing electrical supply and resetting signals to the modules; sequence circuit means connecting each module to each adjacent module and adapted to transmit setting signals from each module to the next module and resetting signals from each module to the preceding module, each module consisting of an insulating housing having a back face provided with means for securing the respective modules to a common supporting member, a front face opposite to the back face and first and second side faces substantially parallel to each other, the first side face of each module cooperating with the second side face of an adjacent module, said front face having first, second and third surface portions, input terminals projecting through the bottoms of outwardly opening sockets arranged on the first surface portion, connecting terminals projecting through the bottoms of outwardly opening sockets arranged on the second surface portion, output terminals projecting through the bottoms of outwardly opening sockets arranged on the third surface portion, said output terminals being connected to the said apparatuses, and said input terminals receiving the said feedback signals, a storage relay unit mechanically coupled in a removable manner to each module, said storage relay unit having a plurality of terminals which are electrically connected in a removable manner to said connecting terminals of the modules, first and second recesses in said first side face and first and second projections on said second side face, each first recess being adapted to receive the first projection of an adjacent module and each second recess being adapted to receive the second projection of an adjacent module; a plurality of transverse conductors within each module, said transverse conductors each having first and second terminals, the said first terminals in each module being adapted for electrical coupling with the second terminals of an adjacent module when said first projections are lodged into said first recesses, to complete the said electrical circuit means, first and second further terminals, the first further terminals in each module being adapted for electrical coupling with the second further terminals of an adjacent module when said second projections are lodged into said second recesses, to complete the said sequence circuit means; and interconnecting means, lodged within the module housing, for connecting the said connecting terminals to the said electrical circuit means, to the said sequence circuit means and to said input and output terminals.

2. A sequential automatic control device, according to claim 1, wherein the said interconnecting means comprise a printed circuit board arranged in the module housing between an insulating sole which forms the said back face and an insulating lid which forms the said front face and carries the said sockets, said printed circuit board having a first face facing the front face of the module and on which the said input, output and connecting terminals are secured and a second face facing the back face of the module and on which the transverse conductors and the first and second further terminals are secured.

3. A sequential automatic control device according to claim 2, wherein said first terminals of the transversal conductors are flat, and project into the first recess, while the said second terminals of the transverse conductors are fork-shaped and lodged within the said first projections.

4. A sequential automatic control device according to claim 1, said device further comprising further outwardly opening sockets arranged on further surface portions of the front face and further terminals projecting through the bottoms of said further sockets and secured to the said interconnecting means.

5. A sequential automatic control device according to claim 1, wherein the said first and third surface portions are on either side of the second surface portion, hooking means being provided on said front face between the first and second and the second and third surface portions, for mechanically coupling the storage relay unit to the module housing.

* * * * *